(12) United States Patent
Nagashima (10) Patent No.: US 9,405,505 B2
(45) Date of Patent: Aug. 2, 2016

(54) CONTROL DEVICE FOR EXECUTING CONTROL PROGRAM INCLUDING FLOATING POINT OPERATION COMMAND FOR CONTROLLING MACHINE AND METHOD OF CONVERTING FLOATING POINT PARAMETER IN CONTROL PROGRAM

(71) Applicant: FANUC Corporation, Minamitsuru-gun, Yamanashi (JP)

(72) Inventor: Noritake Nagashima, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 124 days.

(21) Appl. No.: 14/508,175

(22) Filed: Oct. 7, 2014

(65) Prior Publication Data

US 2015/0100611 A1   Apr. 9, 2015

(30) Foreign Application Priority Data

Oct. 9, 2013 (JP) .................................. 2013-211641

(51) Int. Cl.
*G06F 7/00* (2006.01)
*G06F 5/00* (2006.01)
*G05B 15/02* (2006.01)
*G05B 19/042* (2006.01)
*H03M 7/24* (2006.01)

(52) U.S. Cl.
CPC ...... *G06F 5/00* (2013.01); *G05B 15/02* (2013.01); *G05B 19/0426* (2013.01); *H03M 7/24* (2013.01); *G05B 2219/15059* (2013.01)

(58) Field of Classification Search
CPC ...... G06F 5/00; G05B 15/02; G05B 19/0426; H03M 7/24

USPC .................................. 708/204, 495–523
See application file for complete search history.

(56) References Cited

U.S. PATENT DOCUMENTS

| | | | | |
|---|---|---|---|---|
| 6,557,096 B1 * | 4/2003 | Ganapathy | ............... | G06F 5/00 708/513 |
| 7,685,213 B2 * | 3/2010 | Reynolds | .............. | G06F 17/215 708/204 |
| 2003/0088597 A1 * | 5/2003 | Wood | ..................... | H03M 7/24 708/204 |

FOREIGN PATENT DOCUMENTS

| | | |
|---|---|---|
| JP | S59-123009 A | 7/1984 |
| JP | H01276222 A | 11/1989 |
| JP | H01280825 A | 11/1989 |
| JP | 2009067071 A | 4/2009 |

OTHER PUBLICATIONS

Decision to Grant a Patent issued in Japanese Patent Application No. 2013-211641 on Feb. 10, 2015 (3 pages) with English Translation (3 pages).

* cited by examiner

*Primary Examiner* — Tan V. Mai
(74) *Attorney, Agent, or Firm* — Drinker Biddle & Reath LLP (57) ABSTRACT

A control device includes: a first conversion unit that converts floating point data generated by an operation of a floating point operation command into a numeric string in first format; and a second conversion unit that converts the numeric string in first format into a numeric string in second format. A character string data generation unit generates a character string data including the numeric strings in first format and in second format and outputs the character string data to an external device or an external storage medium.

11 Claims, 8 Drawing Sheets

```
D0000 P1234.567 (449A5225)
D0004 P0.333333 (3EAAAAA0)
D0008 P12.34567 (414587DD)
D0012 P-123456.8 (C7F12066)
D0016 P3.1 (40466666)
D0020 P0 (00000000)
D0024 P1.234568E+007 (4B3C6150)
D0028 P1.324568E+014 (56F0F001)
D0032 P9.999999 (411FFFFF)
D0036 P5.555555 (40B1C71B)
D0040 P3.333333 (40555554)
D0044 P1.111111 (3F8E38E3)
D0048 P3.14159 (40490FD0)
D0052 P2 (40000000)
D0056 P3.5 (40600000)
D0060 P10.1 (4121999A)
D0064 P12345.6 (4640E666)
D0068 P123 (42F60000)
D0072 P33333 (47023500)
D0076 P1.01 (3F8147AE)
D0080 P1.00001 (3F800054)
D0084 P0.999999 (3F87FFFEF)
D0088 P7.777778 (40F8E38F)
```

FIG. 4

- WHEN REAL NUMBER VALUE DISPLAYED ON SCREEN IS OUTPUTTED INTO FILE AS PARAMETER FOR BACKUP, DATA IN INTERNAL FORMAT WHICH EXPRESSES FLOATING POINT DATA IS CONVERTED INTO NUMERIC STRING IN DECIMAL FORMAT AND NUMERIC STRING IN HEXADECIMAL FORMAT, AND CHARACTER STRING INCLUDING BOTH OF THEM IS OUTPUTTED
- WHEN NUMERIC STRING IN DECIMAL FORMAT CANNOT BE EXPRESSED WITHIN NUMBER OF SIGNIFICANT DIGITS, IT IS DESCRIBED AS ONE WITH EXPONENT PART
- PARAMETER FORMAT D[PARAMETER NUMBER] P[NUMERIC STRING IN DECIMAL FORMAT] ([NUMERIC STRING IN HEXADECIMAL FORMAT])
- AS TO NUMERIC STRING IN DECIMAL FORMAT IN THE CASE OF 32-BIT FLOATING POINT DATA, SINCE NUMBER OF SIGNIFICANT DIGITS OF IT IS 7, IT IS ROUNDED AT EIGHTH DIGIT (ROUNDING-OFF)
- AS TO NUMERIC STRING IN DECIMAL FORMAT IN THE CASE OF 64-BIT FLOATING POINT DATA, SINCE NUMBER OF SIGNIFICANT DIGITS OF IT IS 15, IT IS ROUNDED AT SIXTEENTH DIGIT (ROUNDING-OFF)

```
D0000 P1234.567 (449A5225)
D0004 P-0.333333 (3EAAAAA0)
D0008 P12.34567 (414587DD)
D0012 P-123456.8 (C7F12066)
D0016 P3.1 (40466666)
D0020 P0 (00000000)
D0024 P1.234568E+028 (4B3C6150)
D0028 P1.324568E+014 (56F0F001)
D0032 P9.999999 (411FFFFF)
D0036 P5.555555 (40B1C71B)
D0040 P3.333333 (40555554)
D0044 P1.111111 (3F8E38E3)
D0048 P3.141593 (40490FD0)
D0052 P2 (40000000)
D0056 P3.5 (40600000)
D0060 P10.1 (4121999A)
D0064 P12345.6 (4640E666)
D0068 P123 (42F60000)
D0072 P33333 (47023500)
D0076 P1.01 (3F8147AE)
D0080 P1.00001 (3F800054)
D0084 P1 (3F87FFEF)
D0088 P7.777778 (40F8E38F)
D0092 P1234567
```

FIG. 7

- NUMERIC STRING IN HEXADECIMAL FORMAT WHICH IS DESCRIBED ALONGSIDE IS CONVERTED INTO INTERNAL FORMAT DATA
- INTERNAL FORMAT DATA IS CONVERTED INTO NUMERIC STRING IN DECIMAL FORMAT USING SAME ALGORITHM AS IN OCCASION OF OUTPUTTING
- CONVERTED DECIMAL NUMBER IS READ IN WITH DESCRIBED DECIMAL NUMBER COMPARED THERETO
- DETECTED IDENTICAL AT D000
  (CONVERTED DECIMAL NUMBER 1234.567 =DESCRIBED DECIMAL NUMBER 1234.567)
  NUMERIC STRING IN HEXADECIMAL FORMAT WHICH IS DESCRIBED ALONGSIDE (449A5225) IS ADOPTED AS INPUT VALUE
- DIFFERENCE IS DETECTED AT D004 !
  (CONVERTED DECIMAL NUMBER 0.333333 ≠ DESCRIBED DECIMAL NUMBER -0.3333333)
  DESCRIBED DECIMAL NUMBER (-0.3333333) IS ADOPTED AS INPUT VALUE AND IS CONVERTED INTO INTERNAL FORMAT DATA TO BE STORED IN MEMORY

⋮

- NO NUMERIC STRING IN HEXADECIMAL FORMAT AT D092
  DECIMAL NUMBER (1234567) IS CONVERTED INTO INTERNAL FORMAT DATA TO BE STORED IN MEMORY

CONTROL DEVICE FOR EXECUTING CONTROL PROGRAM INCLUDING FLOATING POINT OPERATION COMMAND FOR CONTROLLING MACHINE AND METHOD OF CONVERTING FLOATING POINT PARAMETER IN CONTROL PROGRAM

RELATED APPLICATION DATA

This application claims priority under 35 U.S.C. §119 and/or §365 to Japanese Application No. 2013-211641 filed Oct. 9, 2013, the entire contents is incorporated herein by reference.

BACKGROUND OF THE INVENTION

1. Field of the Invention

The present invention relates to a control device that executes a control program including a floating point operation command for controlling a machine and a method of converting a floating point parameter in the control program.

2. Description of the Related Art

Data of types handled in a control program of a control device for controlling a machine such as a programmable controller includes data in bit format, in byte format, in word format and in similar format. The data of each type is stored in an internal memory. Moreover, there is also a control device, for controlling a machine, which handles the floating point data defined by IEEE754 in operation commands and the like of the control program.

The control device for controlling a machine outputs various data as parameter data in a predetermined format to an external device such as a personal computer or an external storage medium, for a backup. The control device for controlling a machine can capture the parameter data that is edited in the external device as needed. Moreover, as to data and the like stored in a non-volatile memory corresponding to the internal memory, there is sometimes a case where initial parameters are created on the external device in advance and inputted to the control device for controlling a machine along with the control program.

Japanese Patent Laid-Open No. 59-123009 discloses a technology in which a real number value stored as floating point data in a memory of a processing device is converted into a decimal format or another format to be outputted to an external device.

As disclosed in Japanese Patent Laid-Open No. 59-123009, if the floating point data stored in the memory of the processing device is converted into a numeric string in decimal format to be outputted at a time of outputting the floating point data to an external storage medium for the purpose of backup or the like, the numeric string contains a rounding error arising in the conversion.

Moreover, Japanese Patent Laid-Open No. 59-123009 discloses a technology in which, when the numeric string in decimal format is read into the processing device from the external storage medium, the numeric string in decimal format is inversely converted into the floating point data. However, with this technique, the numeric string in decimal format is converted into the floating point data containing the error arising in the conversion into the decimal number. The original floating point data cannot be restored.

Furthermore, Japanese Patent Laid-Open No. 59-123009 also discloses a technology in which the floating point data stored in the memory of the processing device is compared with the floating point data that is obtained by inversely converting the numeric string in decimal format outputted to the external storage medium thereinto. Since such a comparison unit attempts comparison within a range including the rounding error, the comparison unit is not usable as one as to whether both pieces of the floating point data are exactly the same value.

As another output format, there is also known a method in which the floating point data is converted into a numeric string in hexadecimal format to be outputted to the external device or the like. This method does not cause the possible contamination of an error in the data on the occasion of data input. Nevertheless, when the content of the numeric string in hexadecimal format is confirmed on the part of the external device, the content cannot be readily recognized because the data is expressed as the numeric string in hexadecimal format.

As still another output format, there is further known a method in which the floating point data is outputted to the external device or the like as it is. In such a case, the outputted floating point data is displayed and/or changed as a numeric string in decimal format on the external device. For the purpose, it is necessary for the external device to have a unit that converts the floating point data into the numeric string in decimal format and/or a unit that inversely converts the numeric string in decimal format into the floating point data.

Such conversion units, however, require that the conversion algorithm implemented in the control device be exactly identical to that implemented in the external device. Otherwise, the conversion operation in the control device possibly differ from that in the external device. It is difficult for the control device to completely match the external device in a CPU including a co-processor and an OS environment. Hence, it is exceedingly difficult to provide such a conversion unit for which the conversion algorithm implemented in the control device should be exactly identical to that implemented in the external device.

SUMMARY OF THE INVENTION

Therefore, an object of the present invention is to provide a control device that controls a machine and a method of converting a floating point parameter in a control program, for outputting floating point data to at least one of an external device and an external storage medium as numeric strings in two different formats such that the operator can readily perform confirmation or editing operation performed on the external device.

More specifically, the present invention has been made to solve the above-mentioned problem and the object of the present invention is to provide a control device that controls a machine and a method of converting a floating point parameter in the control program, for outputting the floating point data to at least one of the external device and the external storage medium as a parameter by converting the floating point parameter into a numeric string in first format which can be readily visually recognized by the operator.

Furthermore, another object of the present invention is to provide a control device including a unit that can perform exact restoration of the original floating point data, in inputting.

Furthermore, still another object of the present invention is to provide a control device, for controlling the machine, for automatically recognizing a change, converting the numeric string in first format into the floating point data, and storing the floating point data in the memory of the control device for controlling a machine when the numeric string in first format which is changed on the external device is inputted.

There is provided a control device according to the present invention configured to execute a control program including a floating point operation command for controlling a machine, the device including: a control program storage memory configured to store the control program; a floating point data holding memory configured to hold floating point data to be used in the floating point operation command and floating point data generated by an operation of the floating point operation command; a first conversion unit configured to convert the floating point data into a numeric string in first format; a second conversion unit configured to convert the floating point data into a numeric string in second format which is different from the first format; a character string data generation unit configured to generate character string data including the numeric string in the first format and the numeric string in the second format; and an output unit configured to output the generated character string data to at least one of an external device and an external storage medium.

The control device may include: an input unit to which the character string data including the numeric string in the first format and the numeric string in the second format from at least one of the external device and the external storage medium is configured to be input; a third conversion unit configured to convert the numeric string in the first format inputted via the input unit into floating point data; and a first storing unit configured to store the floating point data obtained from conversion by the third conversion unit in the floating point data holding memory.

The control device may further include: a fourth conversion unit configured to convert the numeric string in the second format inputted via the input unit into floating point data; a fifth conversion unit configured to convert the floating point data obtained from conversion by the fourth conversion unit into a numeric string in the first format; a comparison unit configured to compare the numeric string in the first format obtained from conversion by the fifth conversion unit with the numeric string in the first format included in the character string data inputted via the input unit; a second storing unit configured to store the floating point data obtained from conversion by the fourth conversion unit in the floating point data holding memory in a case where the numeric strings are identical as a result of comparison by the comparison unit; and a third storing unit configured to store the floating point data obtained from conversion by the third conversion unit in the floating point data holding memory in a case where the numeric strings are different as the result of the comparison by the comparison unit.

The conversion of the floating point data into the numeric string in the first format may include a rounding operation to a predetermined number of digits. The rounding operation may be a rounding operation of rounding-off to a predetermined number of digits.

The numeric string in the second format may be a numeric string obtained by converting the floating point data into any of a binary number, an octal number and a hexadecimal number.

The output unit may output a parameter file generated so as to include the generated character string data.

The input unit may be a unit to which the parameter file which is outputted from the output unit and generated so as to include the generated character string data is input.

According to the present invention, the control device for controlling a machine can be provided for which the floating point data is outputted to at least one of the external device and the external storage medium as the numeric strings in two different formats such that the operator can readily perform confirmation or editing operation performed on the external device. Notably, the input and output of the control device may be performed in a format of sequential output of the character string data or in a format of a file which is generated so as to include the character string data.

According to the present invention, a method of converting a floating point parameter in a control program including a floating point operation command for controlling a machine, the method including: holding floating point data generated by an operation of the floating point operation command from floating point data held in a floating point data holding memory; converting the floating point data into a numeric string in first format; converting the floating point data into a numeric string in second format which is different from the first format; generating character string data including the numeric string in the first format and the numeric string in the second format; and outputting the generated character string data to at least one of an external device and an external storage medium.

Furthermore, the method may include the steps of: inputting the character string data including the numeric string in the first format and the numeric string in the second format from at least one of the external device and the external storage medium; converting the numeric string in the first format inputted in the input step into floating point data; and storing the floating point data in the floating point data holding memory.

Furthermore, the method may include: a fourth conversion step of converting the numeric string in the second format inputted in the input step into floating point data; a fifth conversion step of converting the floating point data obtained from conversion in the fourth conversion step into a numeric string in the first format; a comparison step of comparing the numeric string in the first format obtained from conversion in the fifth conversion step with the numeric string in the first format included in the character string data inputted in the input step; and a comparison result storing step of storing the floating point data obtained in the fourth conversion step in the floating point data holding memory in a case where the numeric strings are identical as a result of comparison by the comparison step, and storing the floating point data obtained in the third conversion step in the floating point data holding memory in a case where the numeric strings are different as the result of the comparison by the comparison step.

The present invention can provide a control device which has the configuration above, thereby, outputs floating point data to at least one of an external device and an external storage medium as a parameter, and in this case, converts it into a numeric string in first format which is readily visually recognized by the operator to output it.

Furthermore, the control device can be provided including a unit that can perform exact restoration to the original floating point data, in inputting.

Furthermore, the control device for controlling a machine can be provided for which to have been changed is automatically recognized and the numeric string in first format is converted into the floating point data to be stored in the memory of the control device for controlling the machine when the numeric string in first format which is changed on the external device is inputted.

BRIEF DESCRIPTION OF THE DRAWINGS

Other aspects and advantages, as well as the above-mentioned ones, of the present invention will be apparent more from the following detailed description of the embodiments with reference to the accompanying drawings which are:

FIG. 8 is an exemplary screen of the display unit after the file after editing is read in;

DETAILED DESCRIPTION OF THE PREFERRED EMBODIMENTS

Figure 1:
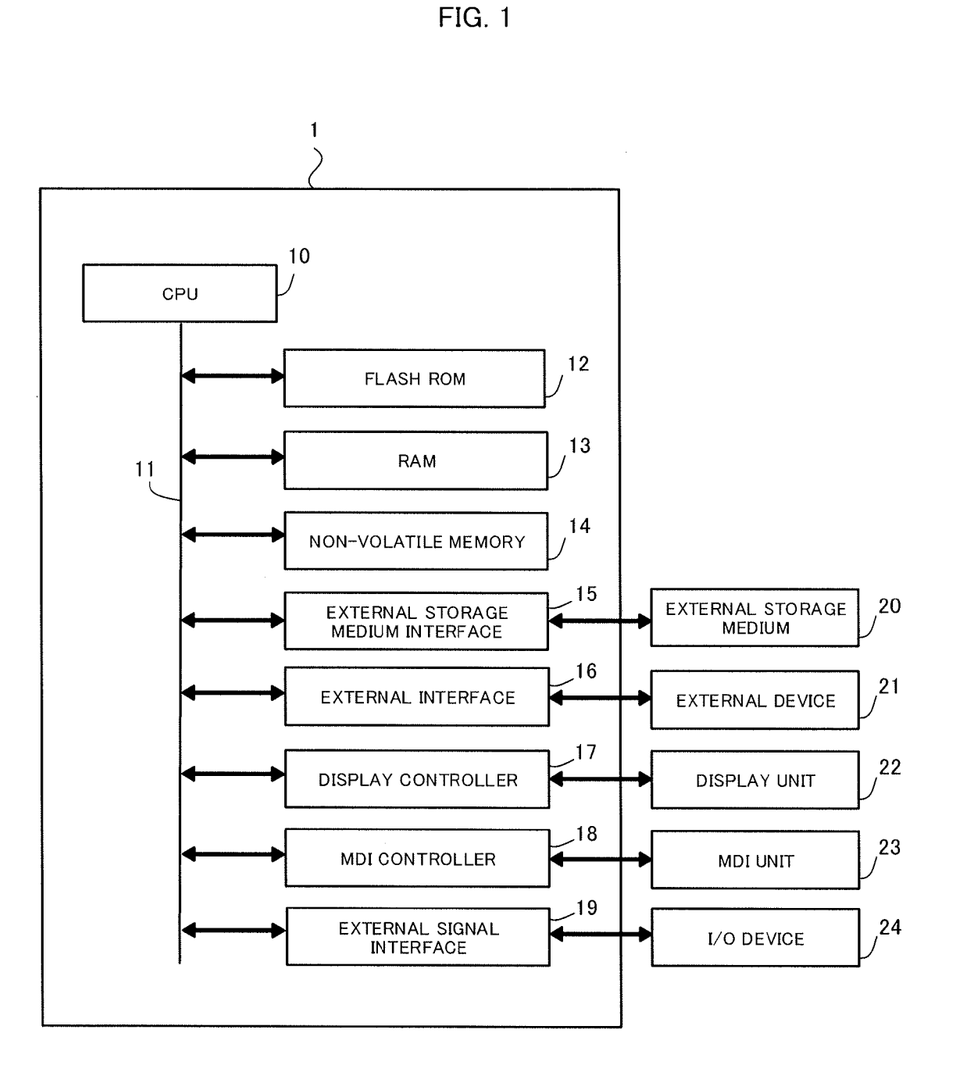
FIG. 1 is a schematic block diagram of a control device that controls a machine.
Figure 9:
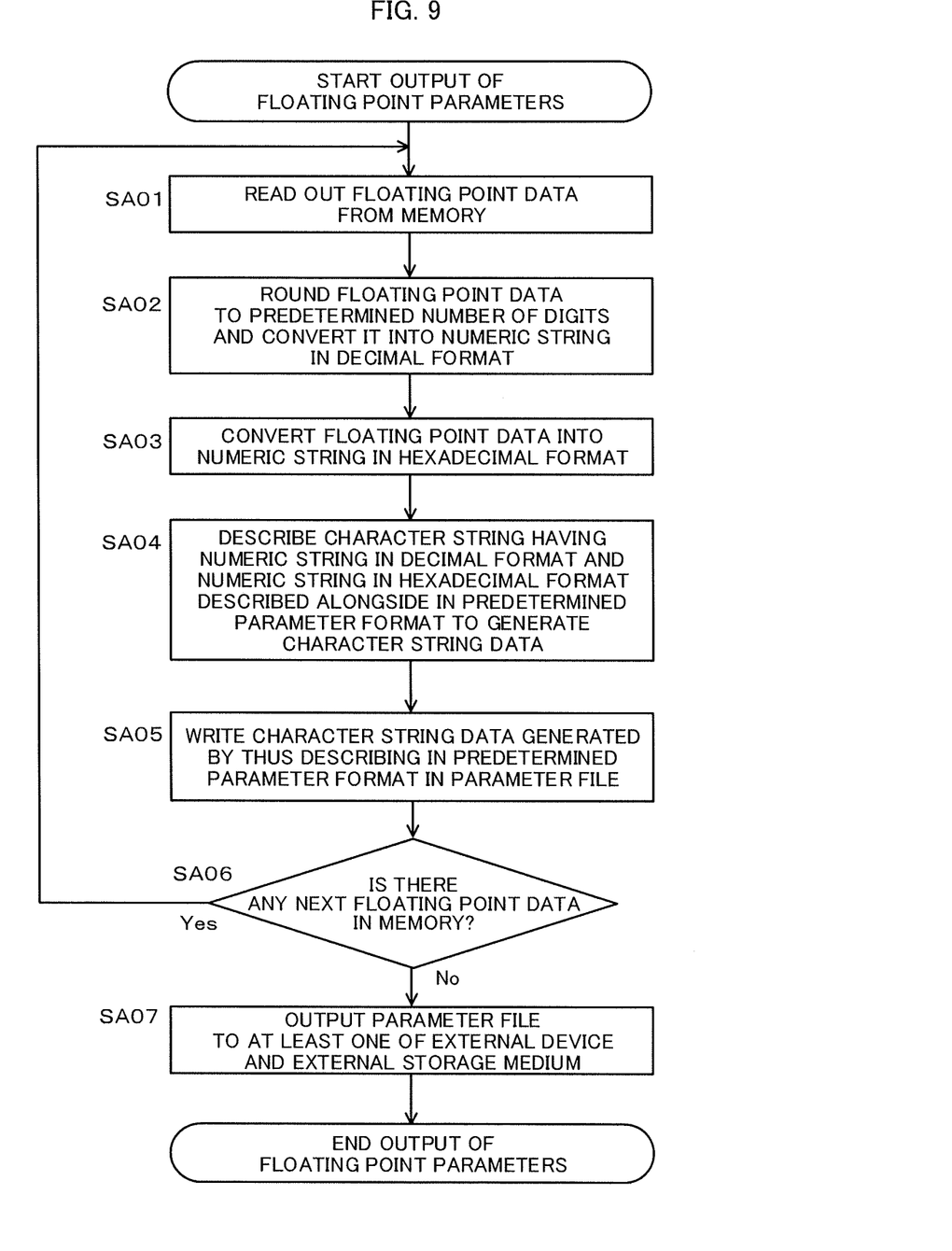
FIG. 9 is a diagram for explaining a flow of processes of file output from the control device to the external device or the external storage medium.
Figure 10:
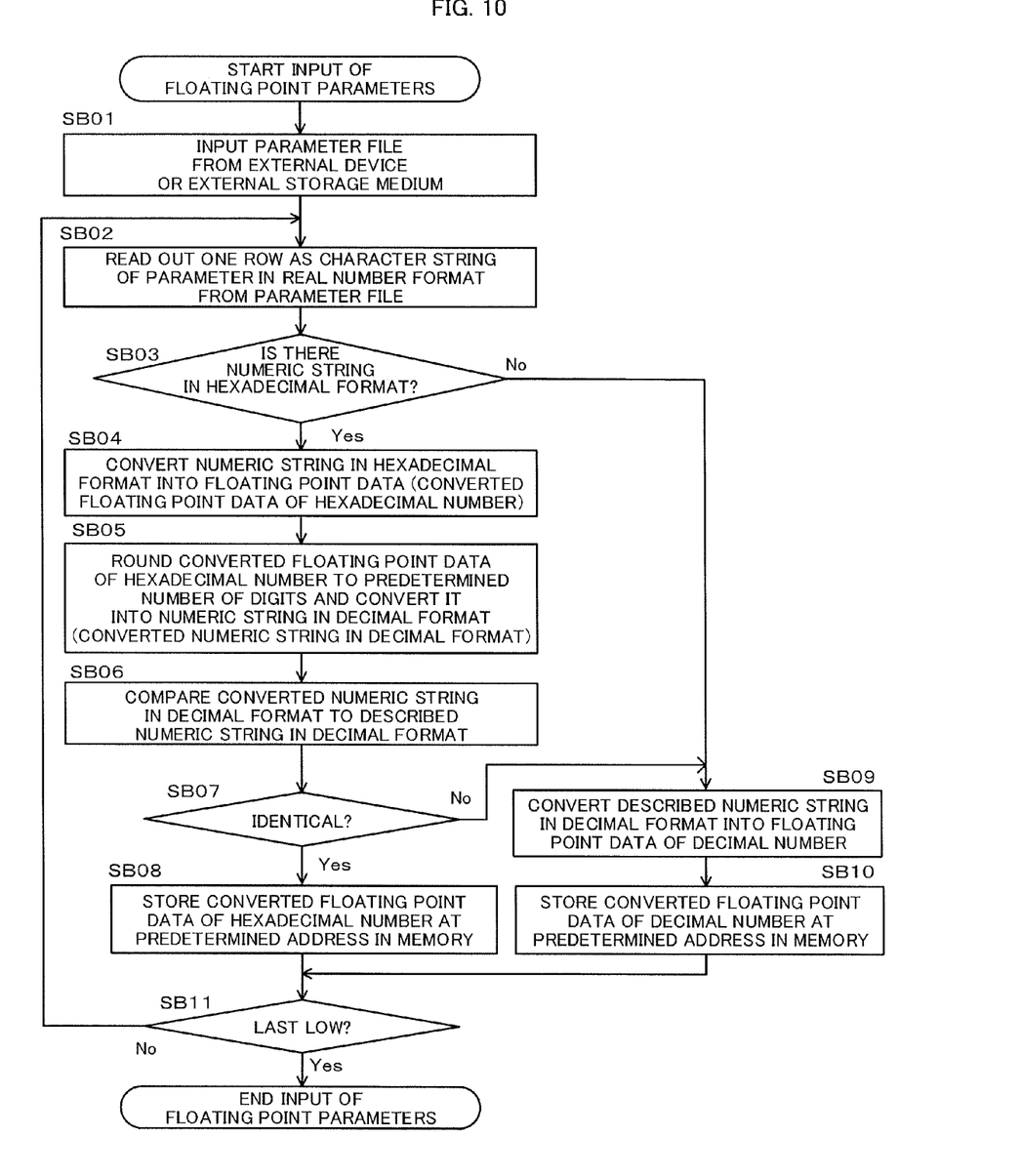
FIG. 10 is a diagram for explaining a flow of processes of file input from the external device or the external storage medium to the control device.

FIG. 1 is a schematic block diagram of a control device that controls a machine. A CPU 10 is a primary processor for whole control in the control device 1. Upon application of power supply to the control device 1, the CPU 10 reads out a system program stored in a rewritable flash ROM 12 and a control program for controlling a machine via a bus 11 and copies them from the flash ROM 12 to a RAM 13. According to the system program, the whole control in the control device 1 is performed. Programs for processes illustrated in FIG. 9 and FIG. 10 are also stored in the flash ROM 12 as a part of the system program. The control program including floating point operation commands is executed for controlling the machine. The RAM 13 stores temporary calculation data, temporary display data and similar data used for the floating point operation command. A non-volatile memory 14 stores correction amounts for tools, parameters and the like. Floating point data mentioned later is also stored in the non-volatile memory 14.

An external storage medium interface 15 is an interface for transmitting and receiving data to/from an external storage medium 20. Specific examples of the external storage medium interface 15 include a USB flash memory interface and a memory card interface. The external storage medium 20 is a storage device that stores data outputted from the control device 1. Specific examples thereof include a USB flash memory and a memory card.

An external interface 16 is an interface for transmitting and receiving data to/from an external device 21. Specific examples of the external interface 16 include the Ethernet (trademark registered) interface and the RS232-C interface. Specific examples of the external device 21 include a personal computer.

A display controller 17 converts digital data such as current positions of axes of the machine, which is not shown in the figure, alarming, parameters, image data and the like into image signals to output them to a display unit 22 constituted of a liquid crystal display device or the like. The image signals are displayed on a display screen of the display unit 22. An MDI controller 18 receives data inputted from an MDI unit 23 to hand it over to the CPU 10. An external signal interface 19 is an interface for I/O signal communication with an I/O device 24. The CPU 10 receives input signals such as signals from operation switches on an operation panel of the not-shown machine via the I/O device 24 and the external signal interface 19. In reverse, output signals from the control device 1 are outputted to the not-shown machine via the external signal interface 19 and the I/O device 24.

Notably, in FIG. 1, axis control circuits that control servo motors, servo amplifiers, a spindle control circuit, a spindle amplifier, an interface for a manual pulse generator, and the like are omitted from the figure.

Figure 2:
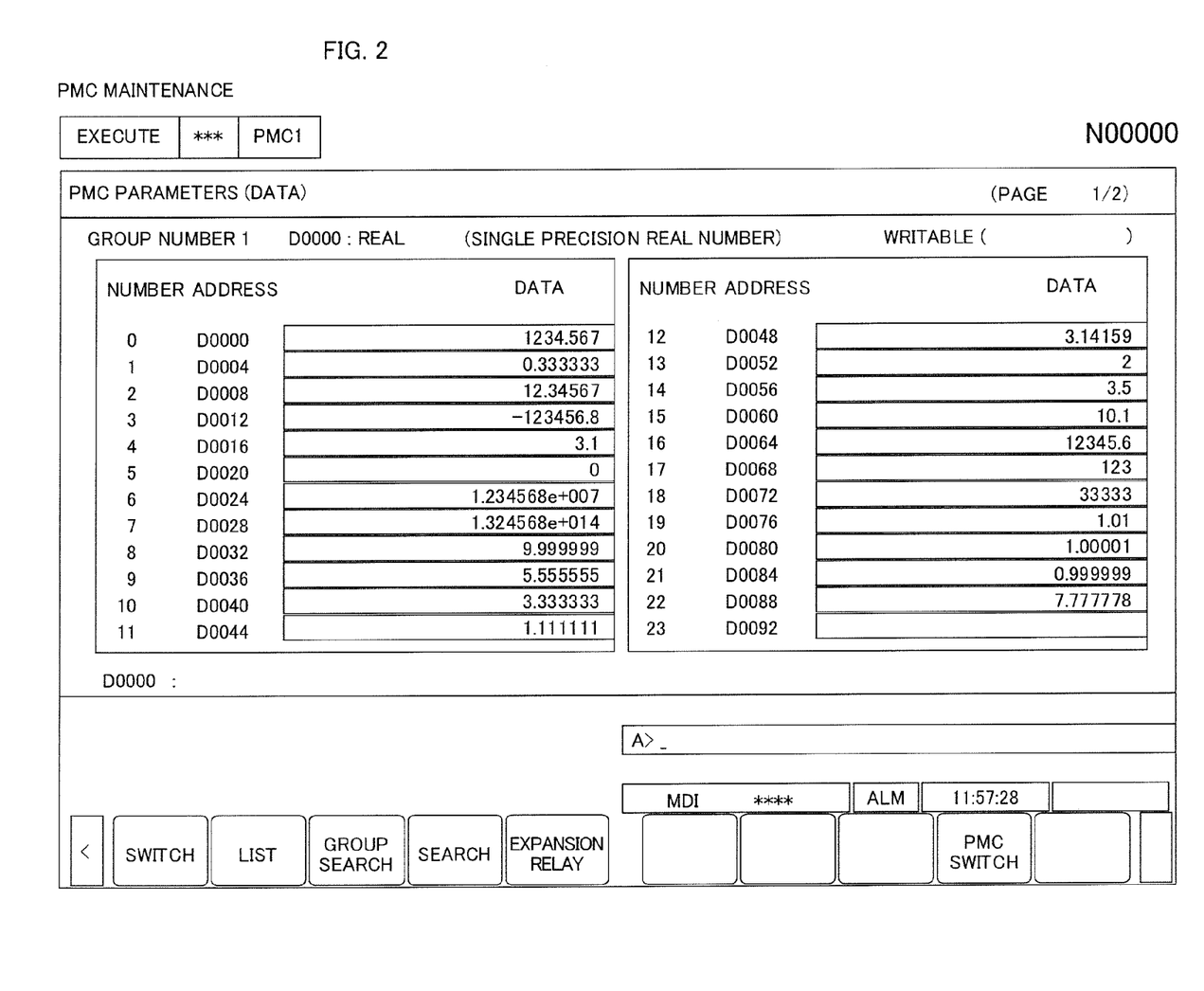
FIG. 2 is an exemplary screen displayed on a display screen of a display unit connected to the control device.

FIG. 2 is an exemplary screen displayed on the display screen of the display unit 22 of the control device 1. The floating point data which is handled by the control device 1 is stored in a memory such, for example, as the non-volatile memory 14. When the floating point data is displayed on the display screen of the display unit 22 of the control device 1, the floating point data is converted into a numeric string in decimal format and rounded to a predetermined number of digits as illustrated in FIG. 2 to be displayed.

On the screen illustrated in FIG. 2, a list of PMC parameters (data) displayed in maintenance operation of a PMC (programmable controller) is displayed. Pieces of the PMC parameter data are displayed at addresses corresponding to number 0 to number 22, that is, at address D0000 to address D0088. In the example displayed on the screen, each piece of the data is displayed as a figure in decimal format which is obtained by rounding 32-bit floating point data as a single precision real number to a predetermined number of digits. When a numeric string in decimal format cannot be expressed within the number of digits of its significant figure, it is expressed with an exponent part. As to a numeric string in decimal format in the case of 32-bit floating point data, the number of significant digits of it is 7. Hence, it is rounded off at the eighth digit. Notably, as to a numeric string in decimal format in the case of 64-bit floating point data, the number of significant digits of it is 15. Hence, it is rounded off at the sixteenth digit.

Figure 3:
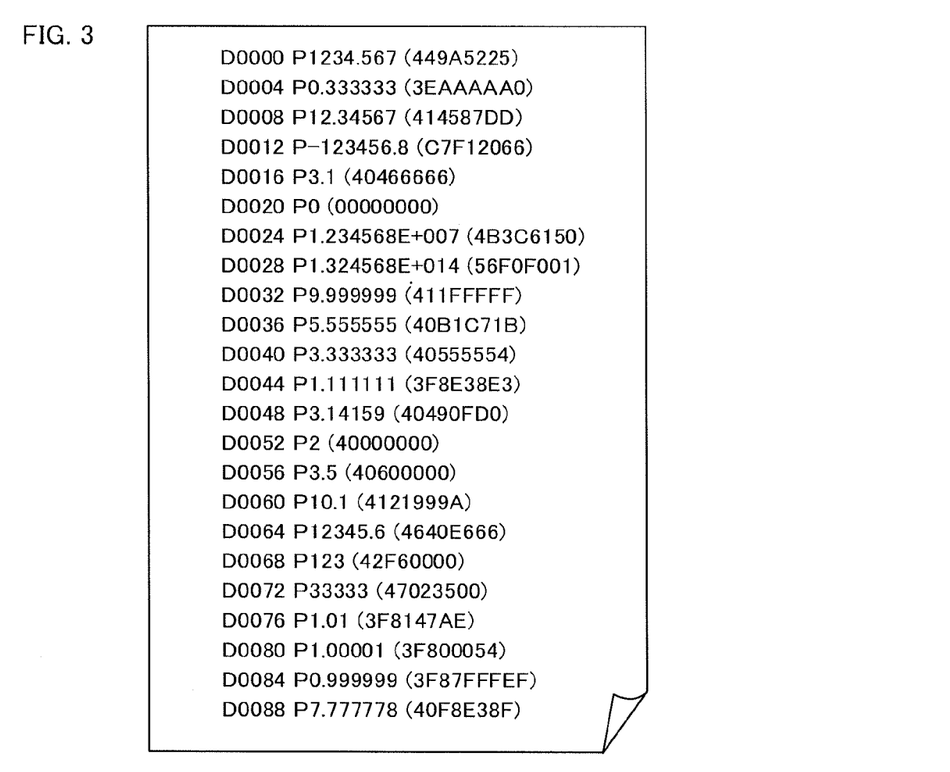
FIG. 3 is an exemplary file outputted from the control device.

When the floating point data is outputted to at least one of the external device 21 and the external storage medium 20 as a part or all of parameters for backup, as illustrated in FIG. 3, the control device 1 converts the floating point data into numeric strings in decimal format which are rounded to a predetermined number of digits, and furthermore, converts it into numeric strings in hexadecimal format which hold the entire information of the floating point data. Next, character string data that includes both of them is generated and the character string data is outputted to at least one of the external device 21 and the external storage medium 20. In FIG. 3, it is outputted from the control device 1 to the external device 21 and/or the external storage medium 20 in a file format.

Figure 4:
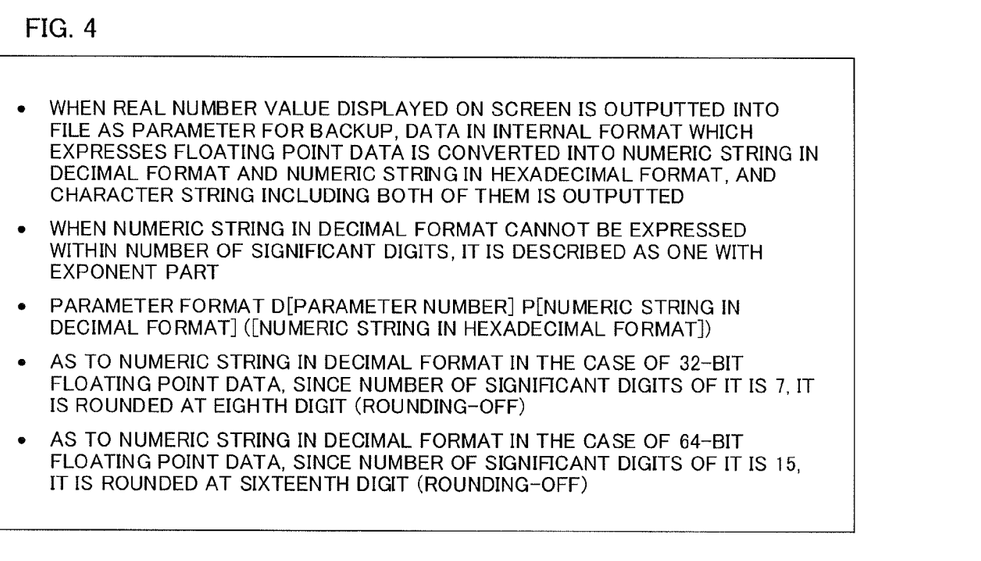
FIG. 4 is a diagram for explaining a format of a file outputted to an external device or an external storage medium from the control device.

Notably, the "numeric string in decimal format" corresponds to the numeric string in a first format, and the "numeric string in hexadecimal format" corresponds to the numeric string in a second format, set forth in the appended claims. FIG. 4 is a diagram for explaining a format of the file outputted from the control device 1 to the external device or the external storage medium. The numeric string in the second format may be a numeric string obtained by converting the floating point data into a binary number or an octal number.

When the operator confirms or edits the numeric strings in decimal format received as a part or all of the parameters for backup on the external device 21 such as a personal computer, he/she opens the parameter file (refer to FIG. 3) stored in the memory of the external device 21 with a general-purpose text editor to confirm or edit it. When the parameter (data) has a portion to be changed, the operator makes a change only at a part of the numeric string in decimal format.

Figure 5:
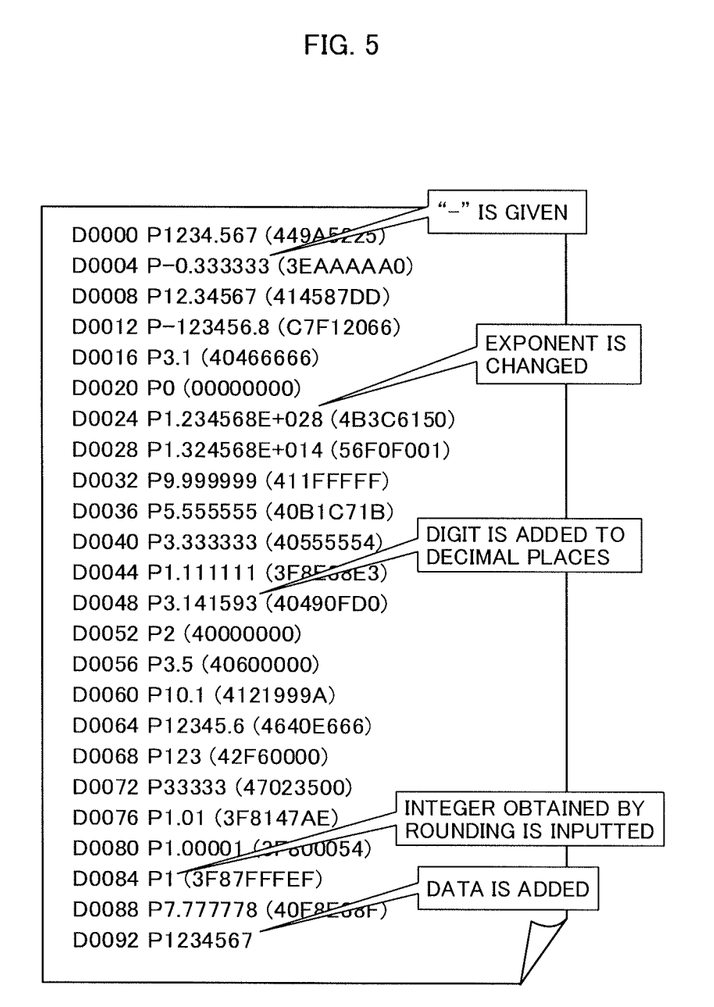
FIG. 5 is an exemplary file after editing displayed on a display screen of a display device of the external device.

FIG. 5 is an exemplary file after editing displayed on the display screen of the display device of the external device 21.

By the operator, as to the exemplary file illustrated in FIG. 3, "-" is given to the data at address D0004, the exponent of the data at address D0024 is changed, a digit is added to the decimal places of the data at address D0048 (for example, "3" is added to the lowest decimal place), the data at address D0084 is rounded up to the integer to be inputted, and data is added at address D0092. FIG. 5 illustrates the editing as above having been performed.

Figure 6:
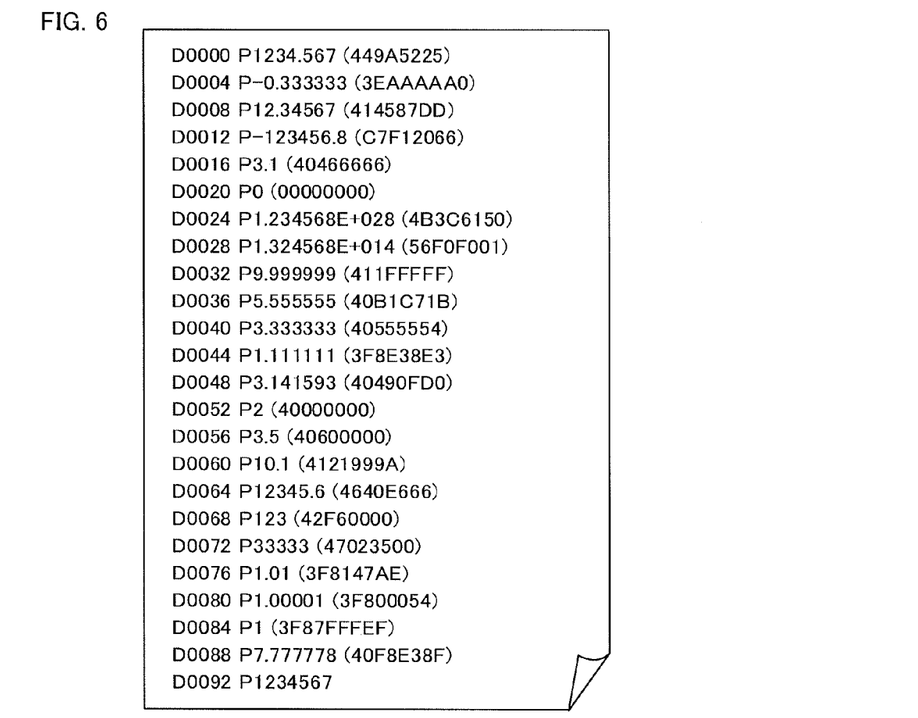
FIG. 6 is an exemplary file inputted to the control device from the external device.

FIG. 6 is an exemplary file having the file edited on the external device 21 (refer to FIG. 5) read in. In this case, FIG. 6 represents the same contents of those in FIG. 5. When the control device 1 stores the parameters for backup in the memory such as the non-volatile memory 14 out of the file read in the control device 1 from the external device 21 or the external storage medium 20, in the case where floating point data is detected in the character string data of the read-in file, the numeric string in hexadecimal format that is described along with it is once converted into floating point data, and furthermore, is converted into a numeric string in decimal format by the same conversion unit as that used in outputting.

Next, it is compared to a numeric string in decimal format that is described in the character string of the read-in file.

As a result of the comparison, when these two numeric strings are identical, the data is regarded as having no change. The numeric string in hexadecimal format is accepted as an input value and the floating point data thereof is stored in the memory such, for example, as the non-volatile memory 14. When the two numeric strings are different from each other, the data is regarded as having been updated. The described numeric string in decimal format is accepted as the input value and is converted into floating point data to be stored in the memory.

Figure 7:
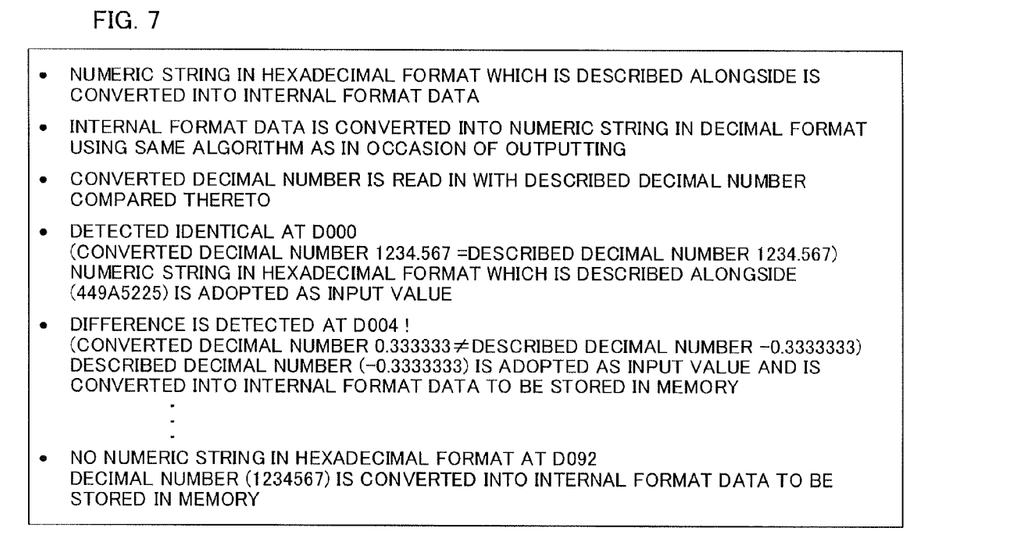
FIG. 7 is a diagram for explaining processes when the file which the control device reads in from the outside is stored in a memory of the control device.
Figure 8:
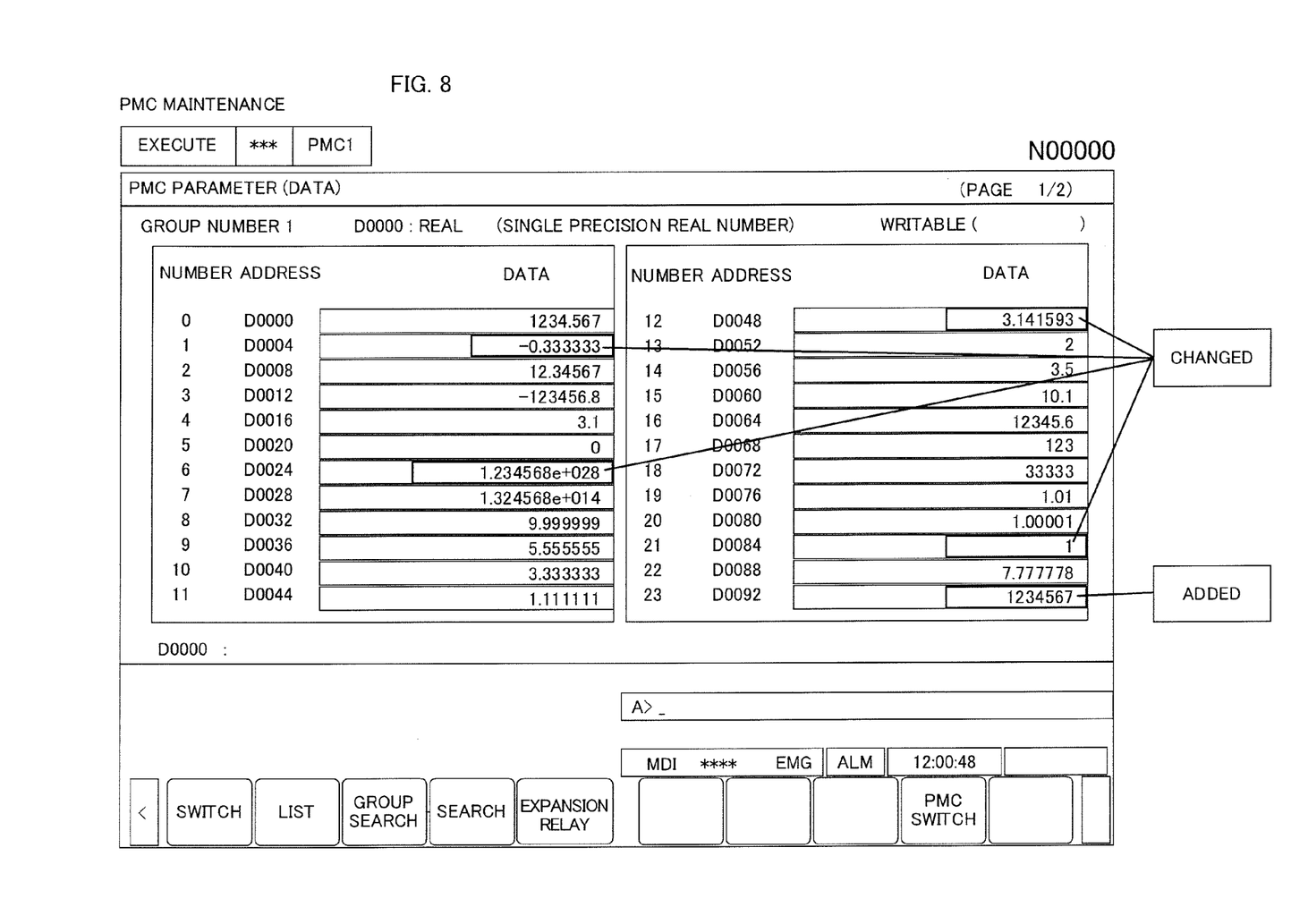

In the above-mentioned scheme of comparison, numeric strings obtained by rounding the numeric strings in decimal format within a predetermined number of digits are compared to each other. The conversion unit into the numeric string in decimal format employs the same algorithm both in outputting and in inputting. Hence, the floating point data is converted into the same numeric string in decimal format. As to the parameter in which only the numeric string in decimal format is described, the numeric string thereof is adopted to be the input value as it is, and converted into floating point data to be stored in the memory. FIG. 7 is a diagram for explaining processes in the occasion that the file which the control device reads in from the outside is stored in the memory of the control device. As illustrated in FIG. 8, each piece of data at the address at which the data is changed or added, is displayed on the display screen of the display unit 22 of the control device 1 with highlighting or color displaying such that the operator can readily recognize it.

A series of the above-mentioned processes performed by the control device 1 are described using flowcharts illustrated FIG. 9 and FIG. 10.

FIG. 9 is a diagram for explaining a flow of processes of file output from the control device to the external device or the external storage medium. Hereafter, the description is made in accordance with the individual steps.

[Step SA01] The floating point data is read out of the memory.

[Step SA02] The floating point data is rounded to the predetermined number of digits and converted into the numeric string in decimal format.

[Step SA03] The floating point data is converted into the numeric string in hexadecimal format.

[Step SA04] The character string having the numeric string in decimal format and the numeric string in hexadecimal format described alongside is described in a predetermined parameter format to generate the character string data.

[Step SA05] The character string data thus described and generated in the predetermined parameter format is written in the parameter file.

[Step SA06] Whether or not any next floating point data is in the memory is determined. In the case of affirmative (YES), the process is returned to step SA01, and in the case of negative (NO), the process is put forward to step SA07.

[Step SA07] The parameter file is outputted to at least one of the external device and the external storage medium and the process is ended.

FIG. 10 is a diagram for explaining a flow of processes of file input from the external device or the external storage medium to the control device. Hereafter, the description is made in accordance with the individual steps.

[Step SB01] The parameter file is inputted from the external device or the external storage medium.

[Step SB02] One row is read out as a character string of the parameter in real number format from the parameter file.

[Step SB03] Whether or not the read-out one row as a character string of the parameter in real number format has a numeric string in hexadecimal format is determined. In the case of affirmative (YES), the process is put forward to step SB04, and in the case of negative (NO), the process is put forward to step SB09.

[Step SB04] The numeric string in hexadecimal format is converted into the floating point data. The obtained data is called converted floating point data of the hexadecimal number.

[Step SB05] The converted floating point data of the hexadecimal number is rounded to the predetermined number of digits and converted into the numeric string in decimal format. The numeric string in decimal format obtained by the conversion is called a converted numeric string in decimal format.

[Step SB06] The converted numeric string in decimal format is compared to the described numeric string in decimal format. The described numeric string in decimal format is the numeric string in decimal format included in the one row, which is read out in step SB02, as a character string of the parameter in real number format.

[Step SB07] Whether or not the converted numeric string in decimal format and the described numeric string in decimal format are identical is determined. In the case where they are identical (YES), the process is put forward to step SB08, and in the case where they are not identical (NO), the process is put forward to step SB09.

[Step SB08] The converted floating point data of the hexadecimal number obtained in step SB04 is stored at a predetermined address in the memory. The process is put forward to step SB11.

[Step SB09] The numeric string in decimal format included in the one row, which is read out in step SB02, as a character string of the parameter in real number format (described numeric string in decimal format) is converted into the floating point data. The data obtained by the conversion is called converted floating point data of the decimal number.

[Step SB10] The converted floating point data of the decimal number obtained by the conversion in step SB09 is stored at a predetermined address in the memory. The process is put forward to step SB11.

[Step SB11] To be at the last row of the parameter file or not is confirmed. In the case of being at the last row (YES), the process is ended, and in the case of not being at the last row (NO), the process is returned to step SB02 and the process is ended.

According to the embodiment of the present invention, the floating point data is outputted to have the numeric string in decimal format and the numeric string in hexadecimal format described alongside. Hence, the value in decimal format can be readily confirmed by the operator using a general-purpose text editor on the external device. Moreover, it can be compatible even when the data is mixedly outputted with conventional bit, byte or word-formatted data.

When the floating point data is changed or the floating point data is newly added by the operator, the numeric string in decimal format, which is readily recognized, can be inputted. Moreover, the numeric string in hexadecimal format is also described alongside. Hence, the floating point data can be restored in the occasion of inputting unchanged data without a concern of error.

When the data update is determined, the numeric string in decimal format is also generated from the numeric string in hexadecimal format described alongside, and both numeric strings in decimal format are compared to each other. In this stage, the conversion unit from the floating point data to the numeric string in decimal format is the conversion unit with the same algorithm both in the occasion of outputting and in the occasion of comparing to be used. Hence, no consideration to a conversion error is necessary at all.

What is claimed is:

1. A control device configured to execute a control program including a floating point operation command for controlling a machine, the device comprising:
    a control program storage memory configured to store the control program;
    a floating point data holding memory configured to hold floating point data to be used in the floating point operation command and floating point data generated by an operation of the floating point operation command;
    a first conversion unit configured to convert the floating point data into a numeric string in first format which can be readily recognized by an operator;
    a second conversion unit configured to convert the floating point data into a numeric string in second format which is different from the first format, the numeric string in second format not including rounding error to the floating point data;
    a character string data generation unit configured to generate character string data including the numeric string in the first format and the numeric string in the second format; and
    an output unit configured to output the generated character string data to at least one of an external device and an external storage medium.

2. The control device according to claim 1, comprising:
    an input unit to which the character string data including the numeric string in the first format and the numeric string in the second format from at least one of the external device and the external storage medium is configured to be input;
    a third conversion unit configured to convert the numeric string in the first format inputted via the input unit into floating point data; and
    a first storing unit configured to store the floating point data obtained from conversion by the third conversion unit in the floating point data holding memory.

3. The control device according to claim 2, further comprising:
    a fourth conversion unit configured to convert the numeric string in the second format inputted via the input unit into floating point data;
    a fifth conversion unit configured to convert the floating point data obtained from conversion by the fourth conversion unit into a numeric string in the first format;
    a comparison unit configured to compare the numeric string in the first format obtained from conversion by the fifth conversion unit with the numeric string in the first format included in the character string data inputted via the input unit;
    a second storing unit configured to store the floating point data obtained from conversion by the fourth conversion unit in the floating point data holding memory in a case where the numeric strings are identical as a result of comparison by the comparison unit; and
    a third storing unit configured to store the floating point data obtained from conversion by the third conversion unit in the floating point data holding memory in a case where the numeric strings are different as the result of the comparison by the comparison unit.

4. The control device according to claim 2, wherein the input unit is the unit, to which the parameter file which is outputted from the output unit and generated so as to include the generated character string data, is configured to be input.

5. The control device according to claim 1, wherein the conversion of the floating point data into the numeric string in the first format includes a rounding operation to a predetermined number of digits.

6. The control device according to claim 5, wherein the rounding operation is a rounding operation of rounding-off to a predetermined number of digits.

7. The control device according to claim 1, wherein the numeric string in the second format is a numeric string obtained by converting the floating point data into any of a binary number, an octal number and a hexadecimal number.

8. The control device according to claim 1, wherein the output unit is configured to output a parameter file generated so as to include the generated character string data.

9. A method of converting a floating point parameter in a control program including a floating point operation command for controlling a machine, the method comprising:
    a floating point data holding step of holding floating point data generated by an operation of the floating point operation command from floating point data held in a floating point data holding memory;
    a first conversion step of converting the floating point data into a numeric string in first format which can be readily recognized by an operator;
    a second conversion step of converting the floating point data into a numeric string in second format which is different from the first format, the numeric string in second format not including rounding error to the floating point data;
    a character string data generation step of generating character string data including the numeric string in the first format and the numeric string in the second format; and
    an output step of outputting the generated character string data to at least one of an external device and an external storage medium.

10. The method of converting a floating point parameter in a control program including a floating point operation command for controlling a machine according to claim 9, the method further comprising:
   an input step of inputting the character string data including the numeric string in the first format and the numeric string in the second format from at least one of the external device and the external storage medium;
   a third conversion step of converting the numeric string in the first format inputted in the input step into floating point data; and
   a floating point data storing step of storing the floating point data in the floating point data holding memory.

11. The method of converting a floating point parameter in a control program including a floating point operation command for controlling a machine according to claim 10, the method further comprising:
   a fourth conversion step of converting the numeric string in the second format inputted in the input step into floating point data;
   a fifth conversion step of converting the floating point data obtained from conversion in the fourth conversion step into a numeric string in the first format;
   a comparison step of comparing the numeric string in the first format obtained from conversion in the fifth conversion step with the numeric string in the first format included in the character string data inputted in the input step; and
   a comparison result storing step of storing the floating point data obtained in the fourth conversion step in the floating point data holding memory in a case where the numeric strings are identical as a result of comparison in the comparison step, and storing the floating point data obtained in the third conversion step in the floating point data holding memory in a case where the numeric strings are different as the result of comparison in the comparison step.

* * * * *